United States Patent
Du et al.

(10) Patent No.: US 12,471,279 B2
(45) Date of Patent: Nov. 11, 2025

(54) CHANNEL STRUCTURES FOR THREE-DIMENSIONAL MEMORY DEVICES AND METHODS FOR FORMING THE SAME

(71) Applicant: Yangtze Memory Technologies Co., Ltd., Hubei (CN)

(72) Inventors: Xiaolong Du, Hubei (CN); Wanbo Geng, Hubei (CN); Zhiliang Xia, Hubei (CN); Xiaoxin Liu, Hubei (CN); Tingting Gao, Hubei (CN); Changzhi Sun, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 647 days.

(21) Appl. No.: 17/655,025

(22) Filed: Mar. 16, 2022

(65) Prior Publication Data

US 2022/0310648 A1 Sep. 29, 2022
US 2023/0276623 A9 Aug. 31, 2023

(30) Foreign Application Priority Data

Mar. 24, 2021 (CN) .......................... 202110312042.9

(51) Int. Cl.
*H10B 43/27* (2023.01)
*H10B 41/10* (2023.01)
*H10B 41/27* (2023.01)
*H10B 41/35* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/27; H10B 43/30; H10B 41/10; H10B 41/35; H10B 43/10; H10B 43/35; H10B 53/20; H10B 53/30; Y02D 10/00; H01L 29/40114; H01L 29/40117; H01L 21/76841;
(Continued)

(56) References Cited

U.S. PATENT DOCUMENTS 10,790,297 B2 9/2020 Chen et al.
10,854,622 B2 12/2020 Yoon et al.
(Continued)

FOREIGN PATENT DOCUMENTS

CN 107425004 A 12/2017
CN 109256393 A 1/2019
(Continued)

*Primary Examiner* — Julio J Maldonado
*Assistant Examiner* — Paul A Berry
(74) *Attorney, Agent, or Firm* — HANLEY, FLIGHT & ZIMMERMAN, LLC

(57) ABSTRACT

A method for forming a three-dimensional memory device includes forming an alternating dielectric stack on a substrate and forming an opening extending partially through the alternating dielectric stack. The opening exposes sidewalls of the alternating dielectric stack. The method also includes disposing a protection layer in the opening and on the exposed sidewalls of the alternating dielectric stack. The method further includes extending the opening through the alternating dielectric stack and forming channel layers in the extended opening.

20 Claims, 11 Drawing Sheets

(51) Int. Cl.
*H10B 43/10* (2023.01)
*H10B 43/35* (2023.01)

(58) Field of Classification Search
CPC ......... H01L 23/53252; H01L 23/53266; H01L 21/187; H01L 21/76838; H01L 21/76843
See application file for complete search history.

(56) References Cited

U.S. PATENT DOCUMENTS

| | | |
|---|---|---|
| 2009/0163029 A1* | 6/2009 | Tsutsumi .......... H01L 21/31116 257/E21.577 |
| 2011/0183497 A1 | 7/2011 | Sakurai et al. |
| 2012/0001249 A1* | 1/2012 | Alsmeier ............... H10B 43/20 438/266 |
| 2014/0264533 A1 | 9/2014 | Simsek-Ege et al. |
| 2014/0367762 A1* | 12/2014 | Tian ....................... H10B 41/35 438/264 |
| 2018/0006041 A1 | 1/2018 | Xu et al. |
| 2020/0119042 A1* | 4/2020 | Chen ................... H01L 21/0206 |
| 2022/0085055 A1 | 3/2022 | Geng et al. |

FOREIGN PATENT DOCUMENTS

| | | |
|---|---|---|
| CN | 109417071 A | 3/2019 |
| CN | 110808251 A | 2/2020 |
| CN | 111463218 A | 7/2020 |
| CN | 112259549 A | 1/2021 |
| CN | 112262473 A | 1/2021 |

\* cited by examiner

CHANNEL STRUCTURES FOR THREE-DIMENSIONAL MEMORY DEVICES AND METHODS FOR FORMING THE SAME

CROSS-REFERENCE TO RELATED APPLICATIONS

This application claims priority to Chinese Patent Application No. 2021103120429.0 filed on Mar. 24, 2021, which is incorporated herein by reference in its entirety.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As such, memory density for planar memory cells approaches an upper limit. A three-dimensional (3D) memory architecture can address the density limitation in planar memory cells.

BRIEF SUMMARY

Embodiments of a three-dimensional (3D) capacitor structure for a memory device and methods for forming the same are described in the present disclosure.

In some embodiments, a method for forming a three-dimensional memory device includes forming an alternating dielectric stack on a substrate and forming an opening extending partially through the alternating dielectric stack. The opening exposes sidewalls of the alternating dielectric stack. The method also includes disposing a protection layer in the opening and on the exposed sidewalls of the alternating dielectric stack. The method further includes extending the opening through the alternating dielectric stack and forming channel layers in the extended opening.

In some embodiments, a method for forming a three-dimensional memory device includes forming an alternating dielectric stack on a substrate that includes disposing first dielectric layers and second dielectric layers in an alternating manner. The method also includes forming an opening in the alternating dielectric stack to expose a first sidewall portion of the alternating dielectric stack. The method further includes disposing a protection layer in the opening and on the exposed first sidewall portion. A thickness of the protection layer gradually decreases from a top to a bottom of the opening. The method further includes extending the opening further into the alternating dielectric stack to expose a second sidewall portion of the alternating dielectric stack. The method further includes performing an etching process on the first dielectric layers to form recesses. The etching process includes etching back a first portion of the first dielectric layers through the exposed second sidewall portion and etching back the protection layer to expose the first sidewall portion. The etching process also includes etching back a second portion of the first dielectric layers though the exposed first sidewall portion. The method further includes forming channel layers in recesses.

In some embodiments, a three-dimensional memory device includes an alternating stack of layers on a substrate having dielectric layers and conductive layers disposed in an alternating manner. The three-dimensional memory device also includes a channel structure extending through the alternating stack of layers. Each dielectric layer of the dielectric layers protrudes from an adjacent conductive layer of the conductive layers by a distance. The distance of the each dielectric layer of the dielectric layers are substantially the same. The three-dimensional memory device also includes a memory layer formed between each conductive layer and the channel structure.

In some embodiments, a method for forming a three-dimensional memory device includes forming, on a side of a substrate, a staircase structure and channel openings extending through the staircase structure. The method also includes forming a protection layer on sidewalls of the channel openings. The method further includes forming channel structures in the channel openings that are covered by the protection layer. The channel structure are formed through the staircase structures.

In some embodiments, a thickness of the protection layer gradually decreases along the depth of the channel opening.

In some embodiments, the protection layer is formed of silicon nitride.

In some embodiments, the method includes forming epitaxial regions at a bottom surface of the channel structures.

In some embodiments, the staircase structure includes alternating layers of multiple insulating layers and sacrificial layers.

In some embodiments, the method also includes removing the protection layer from the channel openings and removing portions of the sacrificial layers adjacent to the channel openings, such that recesses for subsequently formed storage-function layers are positioned between adjacent insulating layers.

In some embodiments, the recesses are formed with uniform depth.

In some embodiments, the storage-function layers include a tunneling layer, a charge storage layer, and a blocking layer.

In some embodiments, forming the storage-function layers include (i) sequentially forming, on the inner surfaces of the channel openings, a blocking layer and a charge storage layer; (ii) removing portions of the blocking layer and charge storage layer that are in excess of the recesses; (iii) exposing ends of the blocking layers and charge storage layers, as well as top surfaces of the epitaxial regions; and (iv) forming tunneling layers in the recesses and on the ends of the blocking layers and charge storage layers.

In some embodiments, the method also includes forming channel layers in the channel openings to cover the top surfaces of the epitaxial region, the tunneling layers, and/or the ends of the blocking layers.

In some embodiments, the method also includes replacing the sacrificial layers with a conductive wordline layer.

In some embodiments, a three-dimensional memory device includes a substrate and an alternating layer stack formed on one side of the substrate. The layer stack includes alternating insulating layers and wordline layers. The memory device also includes channel structures extending through the layer stack. An insulating layer extends further into the channel structure in comparison to an adjacent wordline layer. In some embodiments, the insulating layers extend into the channel structure by substantially uniform depths. In some embodiments, the memory device also include storage-function layers are formed between the wordline layer and the channel structure.

In some embodiments, the storage-function layer includes a blocking layer, a charge storage layer, and a tunneling layer.

In some embodiments, the blocking layer is positioned at the end of a wordline layer that is adjacent to the channel structure.

In some embodiments, the charge storage layer is formed on the blocking layer.

In some embodiments, the tunneling layer is formed on the blocking layer and the charge storage layer, and that the tunneling layer covers the charge storage layer and/or the ends of the blocking layer.

In some embodiments, the memory device also includes an epitaxial layer formed at a bottom surface of the channel structure, the epitaxial layer being in contact with a substrate and the bottom-most wordline layer that is adjacent to the substrate.

In some embodiments, the channel structure includes a channel layer continuously covering a top surface of the epitaxial layer and each of the tunneling layer and/or the ends of the blocking layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
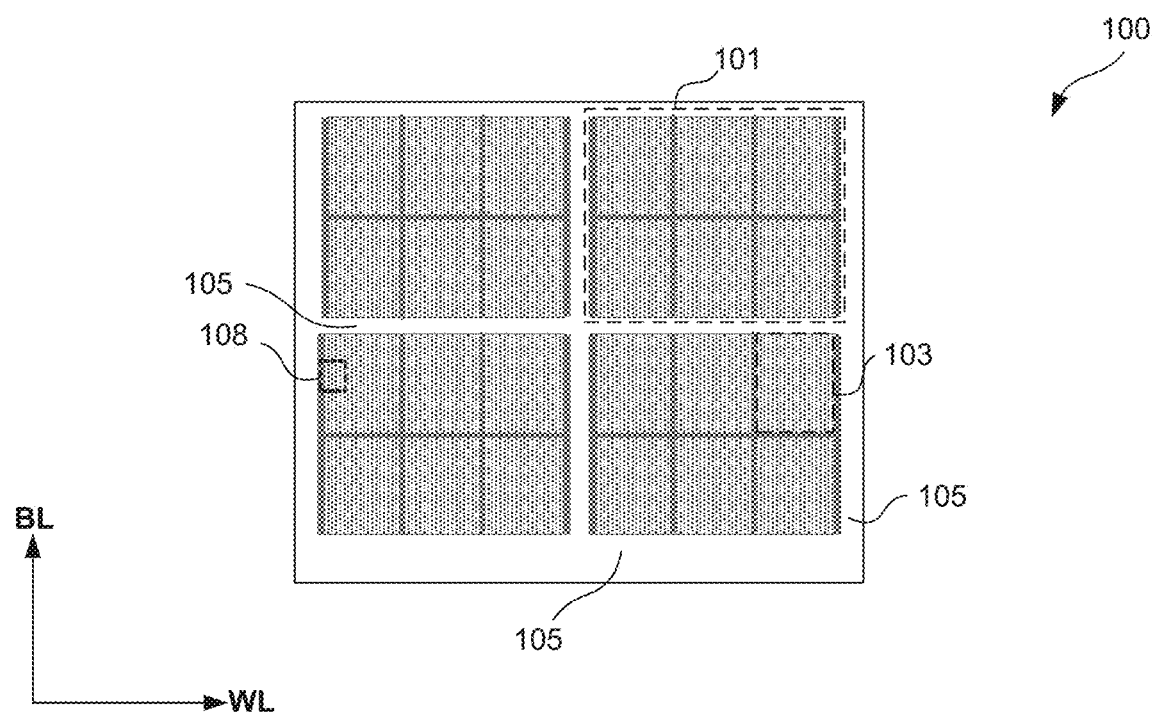
FIG. 1A illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As the development of 3D memory (e.g., 3D NAND flash memory) progress towards high density and high capacity memory cells, the number of staircase layers in 3D memory devices continues to increase. Channel structures extend through the staircase layers and are connected to the underlying substrate. As more and more staircase layers are stacked on each other, high quality channel structure are becoming more critical to prevent coupling between adjacent memory cells and lateral migration of charges.

Various embodiments in accordance with the present disclosure provide structures and fabricating methods for channel structures that improves data retention and reduce coupling between adjacent memory cells. The fabrication method disclosed herein can prevent over-etching and under etching of upper and lower portions of the channel opening, respectively. Channel openings are formed by a multi-step etching process which includes performing a first etching process to form an opening extending through a portion of the staircase layers, depositing a protection layer with non-uniform thickness on the sidewalls of the opening, and performing a second etching process to remove the protection layer and extend the opening into the underlying substrate. The upper portions of the opening is protected by the protection layer while the lower portions of the opening is exposed to the etching chemicals of the second etching process. The non-uniform thickness of the protection layer enables selective etch of the lower portions of the opening, which in turn provides the benefit of forming a channel opening with uniform width in both the upper and lower portions of the opening.

FIG. 1A illustrates a top-down view of an exemplary three-dimensional (3D) memory device 100, according to some embodiments of the present disclosure. 3D memory device 100 can be a memory chip (package), a memory die or any portion of a memory die, and can include one or more memory planes 101, each of which can include a plurality of memory blocks 103. Identical and concurrent operations can take place at each memory plane 101. Memory block 103, which can be megabytes (MB) in size, can be the smallest size to carry out erase operations. Shown in FIG. 1, exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIGS. 1A and 1B. In this disclosure, memory block 103 is also referred to as a "memory array" or "array." The memory array is the core area in a memory device, performing storage functions.

3D memory device 100 also includes a periphery region 105, an area surrounding memory planes 101. Periphery region 105 can contain many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

The arrangement of memory planes 101 in 3D memory device 100 and the arrangement of memory blocks 103 in each memory plane 101 illustrated in FIG. 1 are only provided as an example, which does not limit the scope of the present disclosure.

Figure 1B:
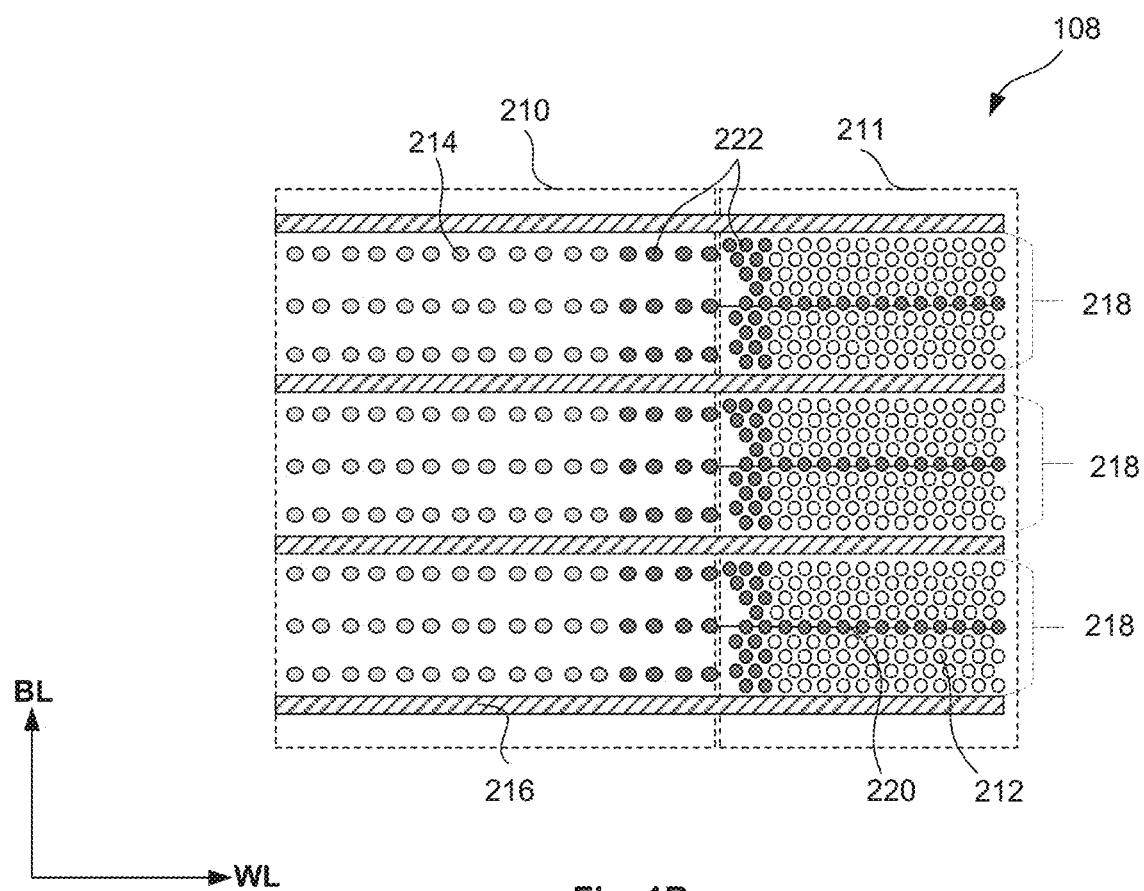
FIG. 1B illustrates a schematic top-down view of a region of 3D memory die, according to some embodiments of the present disclosure.

Referring to FIG. 1B, an enlarged top-down view of a region 108 in FIG. 1A is illustrated, according to some embodiments of the present disclosure. Region 108 of 3D memory device 100 can include a staircase region 210 and a channel structure region 211. Channel structure region 211 can include an array of memory strings 212, each including a plurality of stacked memory cells. Staircase region 210 can include a staircase structure and an array of contact structures 214 formed on the staircase structure. In some embodiments, a plurality of slit structures 216, extending in WL direction across channel structure region 211 and staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings for process variation control during fabrication and/or for additional mechanical support.

Figure 2:
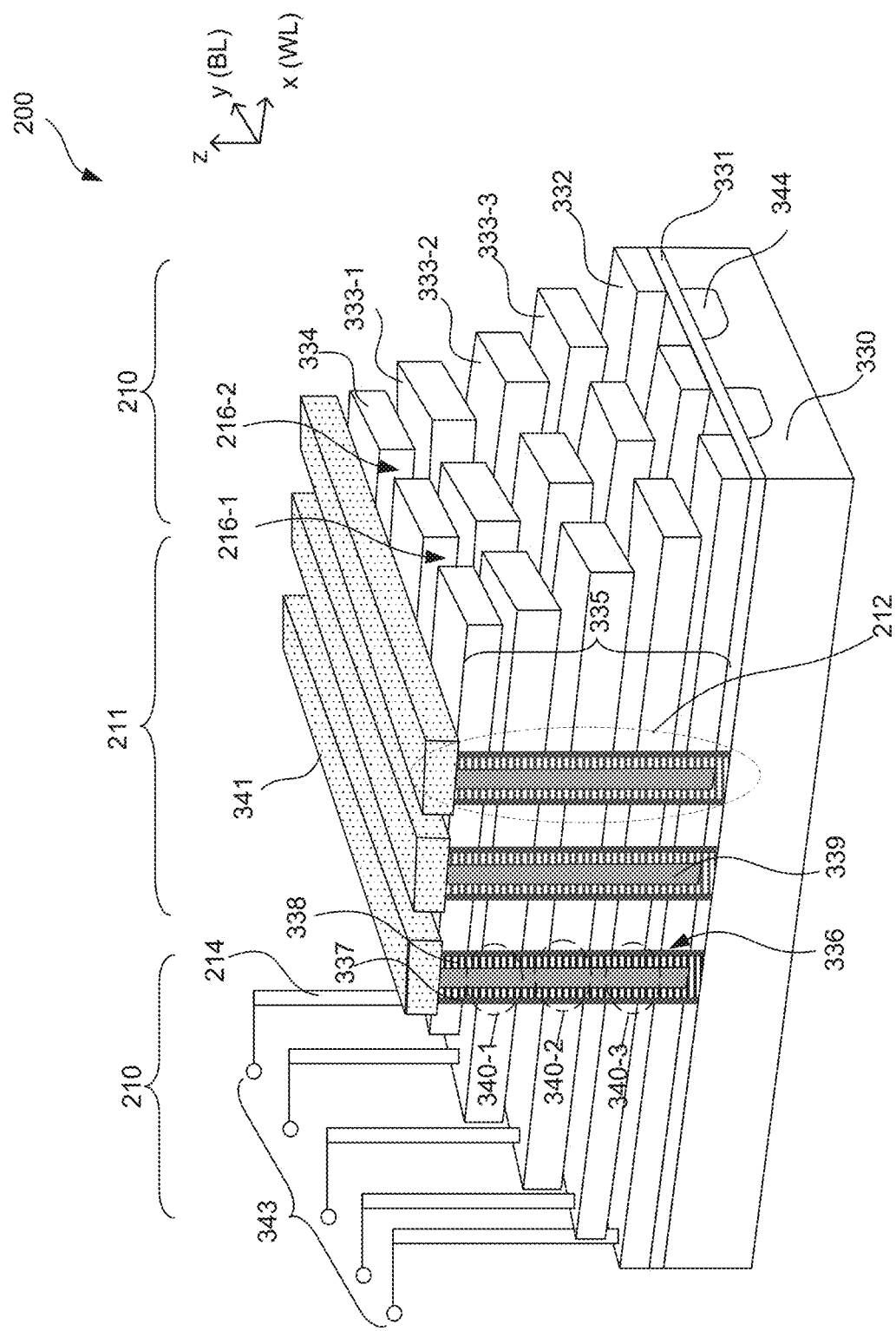
FIG. 2 illustrates a perspective view of a portion of an exemplary 3D memory array structure, in accordance with some embodiments of the present disclosure.

FIG. 2 illustrates a perspective view of a portion of an exemplary three-dimensional memory array structure 200, according to some embodiments of the present disclosure. Memory array structure 200 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 2 for clarity.

The control gates of each tier are separated by slit structures 216-1 and 216-2 through the film stack 335. Memory array structure 200 also includes a tier of top select gates (TSGs) 334 over the stack of control gates 333. The stack of TSG 334, control gates 333 and LSG 332 are also referred to as "gate electrodes." Memory array structure 300 further includes memory strings 212 and doped source line regions 344 in portions of substrate 330 between adjacent LSGs 332. Each memory strings 212 includes a channel hole 336 extending through insulating film 331 and film stack 335 of alternating conductive and dielectric layers. Memory strings 212 can also include a memory film 337 on a sidewall of the channel hole 336, a channel layer 338 over the memory film 337, and a core filling film 339 surrounded by the channel layer 338. A memory cell 340 can be formed at the intersection of control gate 333 and memory string 212. Memory array structure 300 further includes a plurality of bit lines (BLs) 341 connected with memory strings 212 over TSGs 334. Memory array structure 300 also includes a plurality of metal interconnect lines 343 connected with the gate electrodes through a plurality of contact structures 214. The edge of film stack 335 is configured in a shape of staircase to allow an electrical connection to each tier of the gate electrodes.

In FIG. 2, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. Memory array structure 200 can also include other structures, for example, TSG cut, common source contact and dummy channel structure. These structures are not shown in FIG. 2 for simplicity.

To achieve higher storage density, the number of vertical WL stacks of a 3D memory or the number of memory cells per memory string has been greatly increased, for example, from 64 stacked WL layers to 128 layers or more. Further increasing the number of vertical WL stacks brings challenges for forming channel structures that extend through the vertical WL stacks. For example, channel openings having high aspect ratios (e.g., ratio of height over width) can lead to over-etching of the upper portion of the openings and under-etching of the lower portions of the opening. The non-uniform etching can lead to cross-talk or undesirable coupling between adjacent memory cells, such as memory cells 340-1, 340-2, and 340-3 illustrated in FIG. 2.

Figure 3:
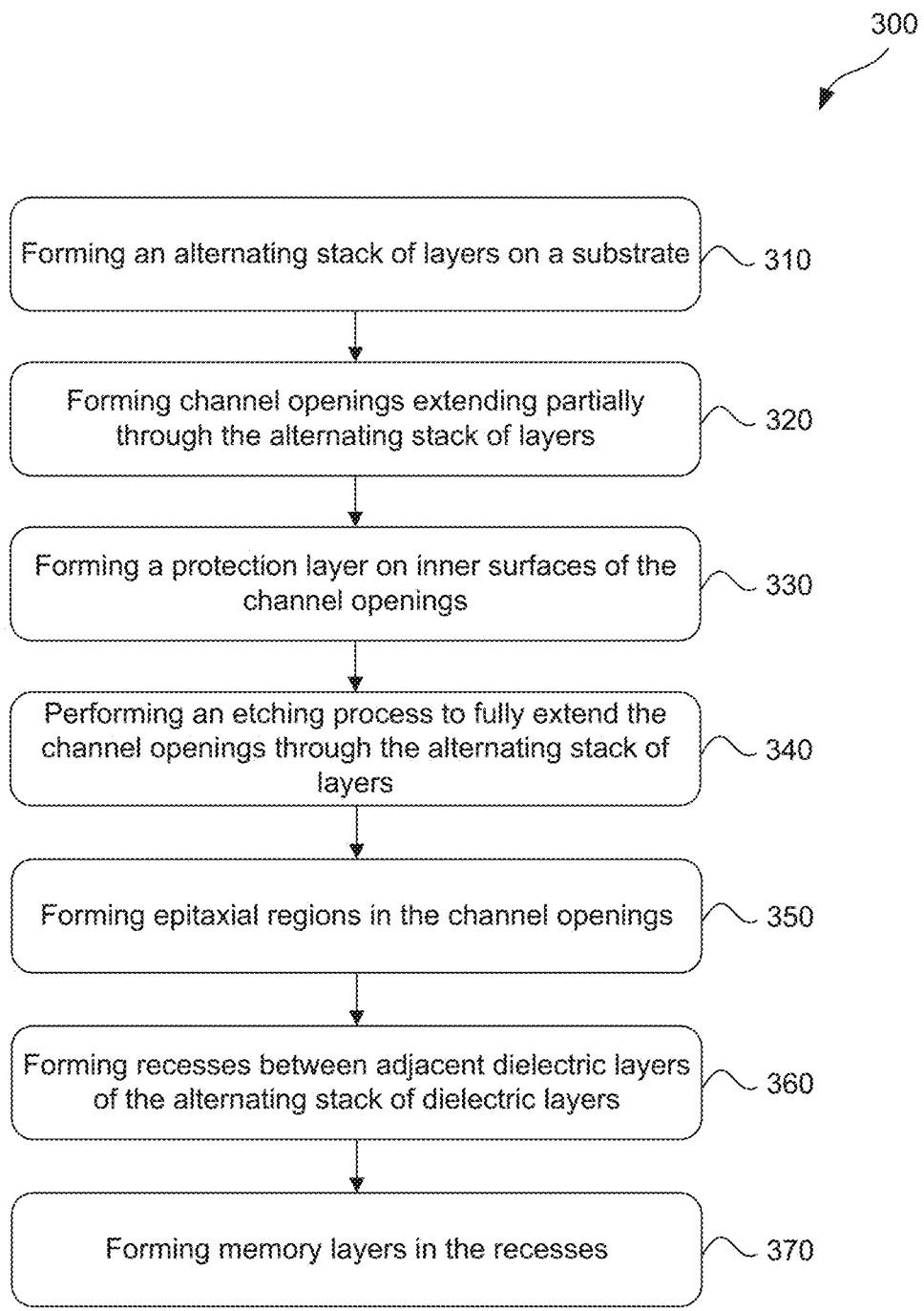
FIG. 3 illustrates a flow diagram of forming channel structures for a 3D memory array structure, in accordance with some embodiments of the present disclosure.

FIG. 3 is a flow diagram of an exemplary method 300 for forming channel structures in 3D memory devices, in accordance with some embodiments of the present disclosure. The operations of method 300 can be performed in a different order and/or vary, and method 300 can include more operations that are not described for simplicity. FIGS. 4-16 are cross-sectional views of fabricating an exemplary semiconductor structure 400 incorporating channel structures. FIGS. 4-16 are provided as exemplary cross-sectional views to facilitate in the explanation of method 300. Although the fabrication process of forming isolation structures in a dielectric layer is described here as an example, the fabrication process can be applied on various other layers, such as on interlayer dielectrics, insulation layers, conductive layers, and any other suitable layers. The fabrication processes provided here are exemplary, and alternative processes in accordance with this disclosure may be performed that are not shown in these figures.

Figure 4:
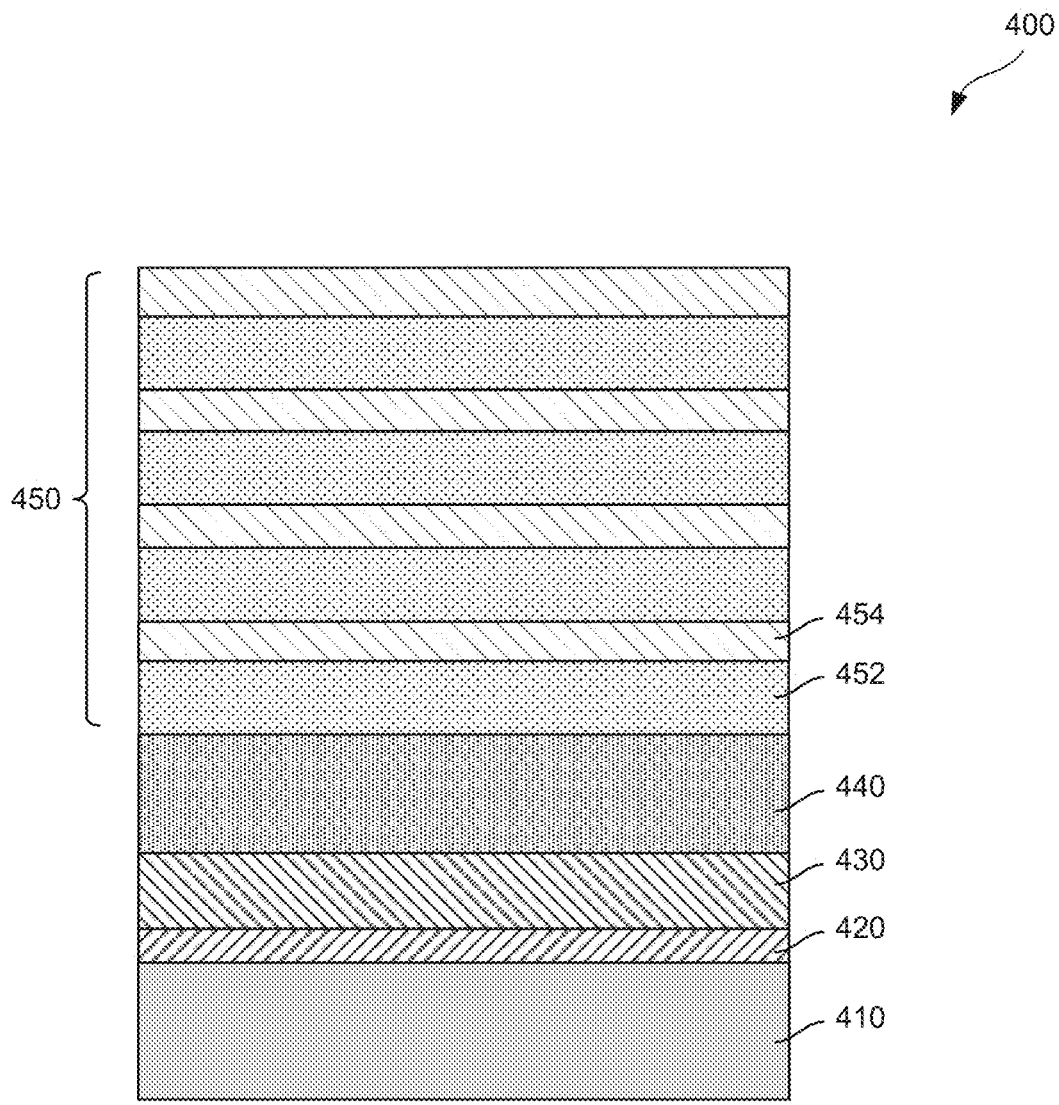
FIGS. 4-16 illustrate cross-sectional views of a 3D memory device at various process stages, according to some embodiments of the present disclosure.

At operation 310, an alternating stack of layers is formed on a substrate, according to some embodiments of the present disclosure. Referring to FIG. 4, semiconductor structure 400 can include various components of a 3D memory device, such as, substrate 410, dielectric layers 420, 430, and 440, and alternating layer stack 450.

Substrate 410 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, substrate 410 can be double-side polished prior to peripheral device fabrication. In this example, substrate 410 includes surfaces on the top and bottom sides both polished and treated to provide a smooth surface for high quality semiconductor devices.

Dielectric layers 420, 430, and 440 can be disposed on substrate 410. In some embodiments, dielectric layer 420, 430, and 440 can be formed of dielectric materials, such as silicon oxide ($SiO_2$), silicon nitride (SiN), silicon oxynitride (SiON), any suitable dielectric materials, and/or combinations thereof. Semiconductor devices be embedded in dielectric layers 420, 430, and 440, and include any suitable semiconductor devices, for example, low-voltage or high-voltage devices, metal oxide semiconductor field effect transistors (MOSFETs), bipolar junction transistors (BJTs), diodes, resistors, capacitors, inductors, etc.

An alternating dielectric stack 450 is disposed, or otherwise deposited, on the dielectric layers, such as on a top surface of dielectric layer 440. In some embodiments, alternating dielectric stack 450 can be disposed directly on substrate 410. Alternating dielectric stack 450 can include pairs of first dielectric layer 452 and second dielectric layer 454 alternatingly disposed on dielectric layer 440. In some embodiments, first dielectric layer 452 can be a sacrificial dielectric layer that is subsequently replaced by a conductive layer. In some embodiments, alternating dielectric stack 450 can be disposed on substrate 410. In some embodiments, each dielectric layer pair includes a SiN layer and a $SiO_2$ layer. For example, first dielectric layer 452 can be formed of SiN and second dielectric layer 454 can be formed of $SiO_2$. Each pair of first dielectric layer 452 and second dielectric layer 454 can be considered as a level (e.g., a step) of subsequently formed three-dimensional memory device. In some embodiments, alternating dielectric layer stack can include any suitable amount of levels, such as 32 levels, 64 levels, 128 levels, etc. In some embodiments, first dielectric layer 452 can be a sacrificial layer that is replaced by a conductive layer in subsequent processing so that alternating dielectric stack 450 can be converted to an alternating conductor/dielectric stack. Alternating dielectric stack 450 can be formed by one or more thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), or any combination thereof. By way of example and not limitation, the height of alternating dielectric stack 450 can range from about 4 µm to about 30 µm.

Figure 5:
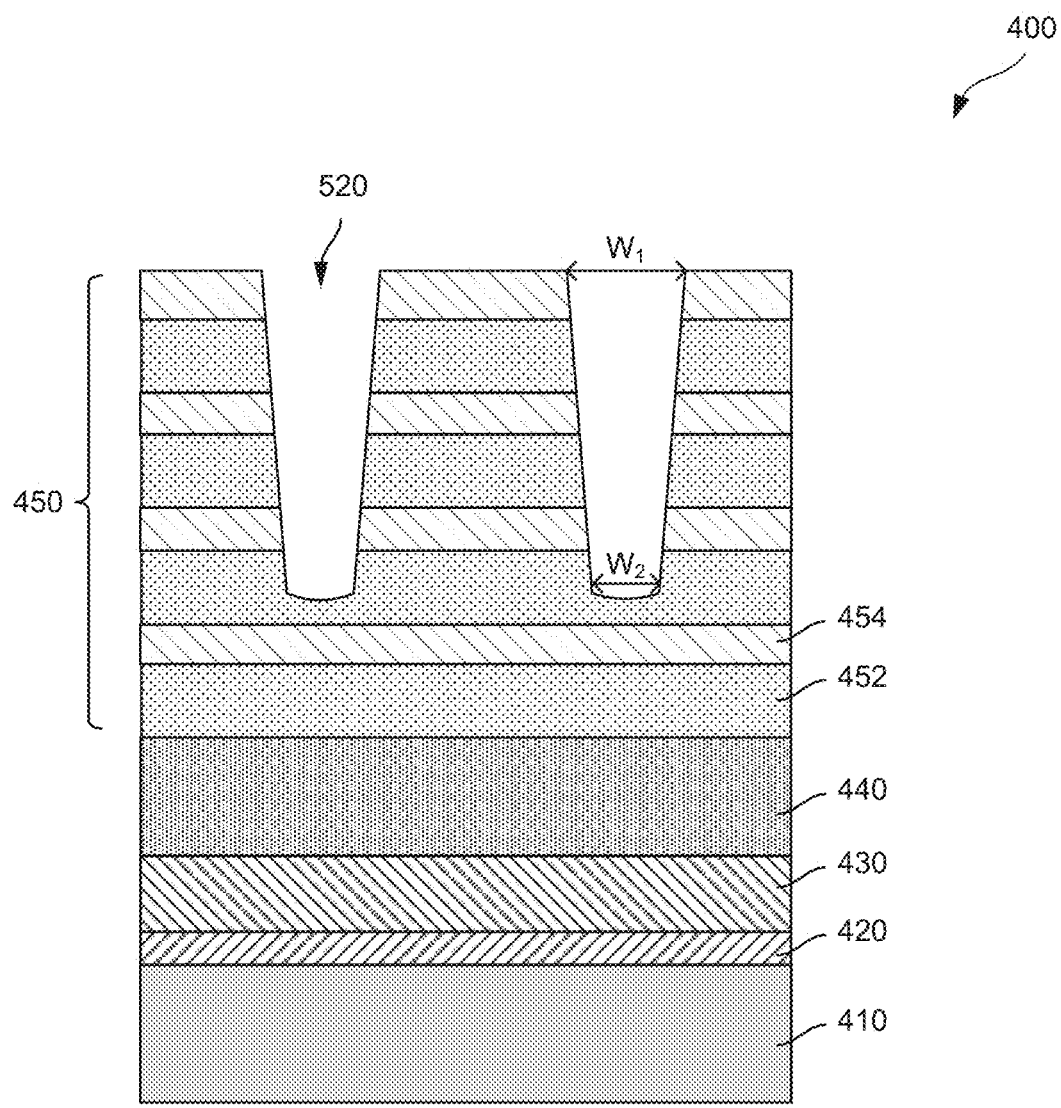

At operation 320, channel openings that partially extend through the alternating stack of layers are formed, according to some embodiments of the present disclosure. Referring to FIG. 5, partial channel openings 520 extend through a portion of the dielectric layers of alternating dielectric stack 450. For example, partial channel openings 520 extend through about 50% to about 80% of the levels of alternating dielectric stack 450. In some embodiments, partial channel openings 520 extend into underlying dielectric layer 440. In some embodiments, partial channel openings 520 extend further into dielectric layers 420 and 430. In some embodiments, partial channel openings 520 are formed without exposing substrate 410. Partial channel openings 520 can be formed using a patterning process followed by one or more etching processes. For example, a photolithography process can be used to expose portions of the top surfaces of alternating dielectric stack 450 to be etched. Dry plasma etching processes or wet chemical etching processes can be used to remove exposed portions of alternating dielectric stack 450. The etching processes can be timed such that a nominal depth of partial channel openings 520 can be achieved. In some embodiments, the etchants can be selected based on the material composition of first and second dielectric layers 452 and 454. For example, the etching processes can include suitable etchants for removing $SiO_2$ and SiN. The etching processes can be a cyclic etching process, including a first etching process configured to remove a first material such as $SiO_2$ and a second etching process configured to remove a second material such as SiN. The cyclic etching process continues until partial channel openings 520 reach a nominal depth. Masking layers such as photoresists can be removed after partial channel openings 520 are formed.

Etchant concentrations can vary depending on the geometric shape of the structure being etched. In general, an upper portion of an opening is exposed to etchants having higher concentration and a lower portion of the opening is exposed to etchants having lower concentration. Therefore, etching rate at a bottom of the opening is lower than that of a top of the opening. As a result, partial channel openings 520 can have a trapezoidal-shaped cross-section area. For example, partial channel openings 520 can have a width $W_1$ at the top of the opening greater than a width $W_2$ at the bottom of the opening. In some embodiments, a ratio of $W_1$ over $W_2$ can be between about 1.1 and 1.5, between about 1.2 and about 1.4, or any suitable ratios. In some embodiments, the widths $W_1$ and $W_2$ can be substantially the same.

Figure 6:
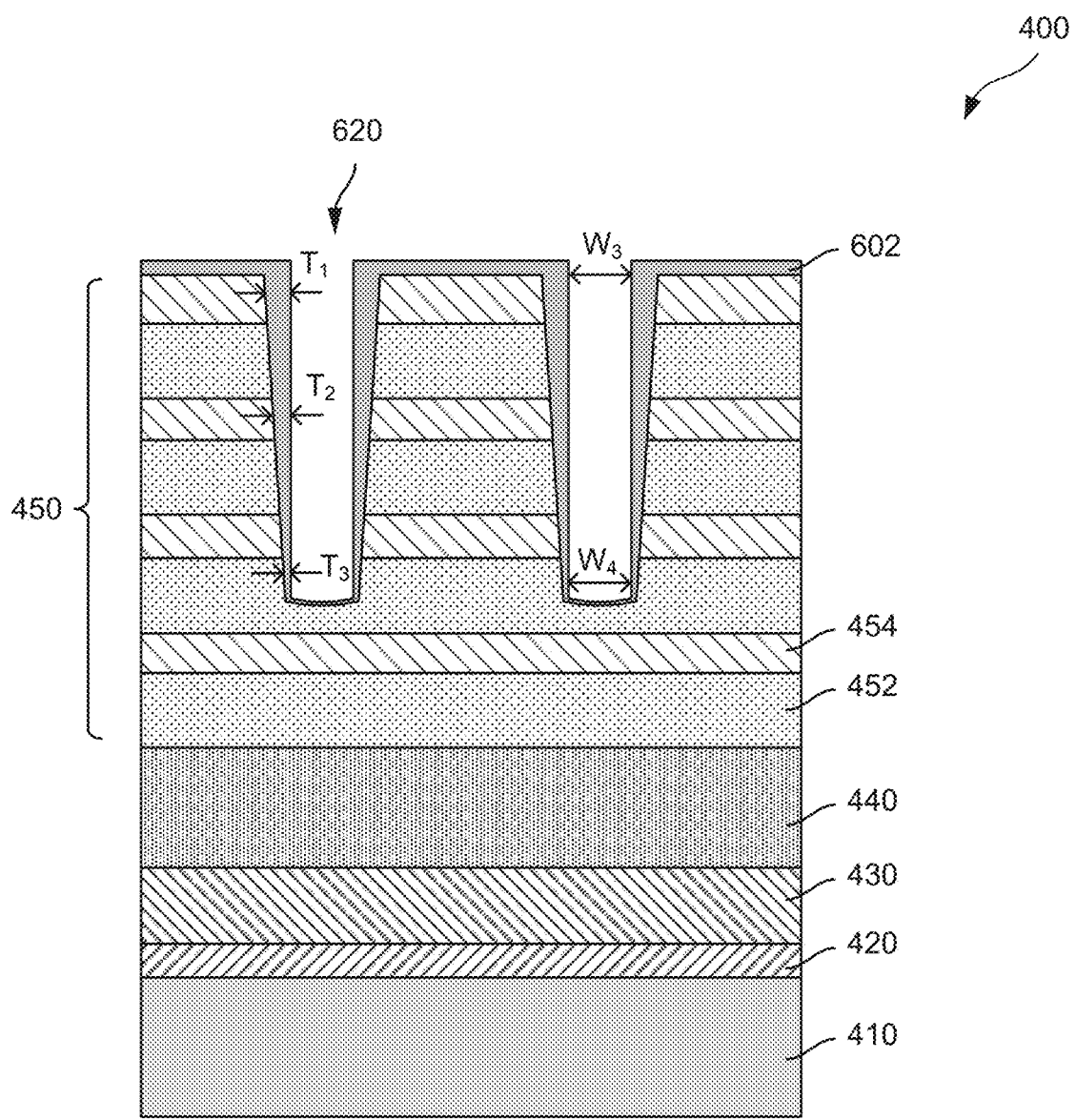

At operation 330, a protection layer is formed on inner surfaces of the channel openings, according to some embodiments of the present disclosure. Referring to FIG. 6, protection layer 602 is formed on top surfaces of alternating dielectric stack 450 and in partial channel openings 520. Specifically, protection layer 602 can be disposed on sidewall surfaces and a bottom surface of openings 520.

A thickness of protection layer 602 measured along sidewalls of partial channel openings 520 can gradually decrease towards a bottom surface of partial channel openings 520. As described above in FIG. 5, partial channel openings 520 can have a trapezoidal cross-sectional area with a greater width at a top portion and a smaller width at a bottom portion of the opening. The decrease in thickness of protection layer 602 can compensate for the uneven width of partial channel openings 520 such that opening 620 surrounded by protection layer 602 can have substantially uniform widths throughout its depth. For example, widths $W_3$ and $W_4$ respectively measured at an upper portion and a lower portion of opening 620 can be substantially the same (e.g., width $W_3$ can be within about 5% of width $W_4$).

Merely for description purposes, thicknesses $T_1$, $T_2$, and $T_3$ of protection layer 602 can be respectively measured at a location within opening 620 at its upper one third portion, middle one third portion, and lower one third portion. In some embodiments, thicknesses $T_1$, $T_2$, and $T_3$ can be the thickness of the respective mid points of the upper one third portion, middle one third portion, and lower one third portion. In some embodiments, thicknesses $T_1$, $T_2$, and $T_3$ can be the respective average thickness of the upper one third portion, middle one third portion, and lower one third portion. In some embodiments, the thickness decrease can be substantially linear. In some embodiments, thickness ratio of $T_2$ over $T_1$ can be between about 0.5 and about 1.0, and similarly, thickness ratio of $T_3$ over $T_2$ can be between about 0.5 and about 1.0. For example, thickness ratio of $T_2$ over $T_1$ can be between about 0.7 and about 0.8, and similarly, thickness ratio of $T_3$ over $T_2$ can be between about 0.7 and about 0.8. In some embodiments, the thickness decrease is non-linear, for example, thickness can decrease at a slower rate in an upper region of partial channel openings 502 compared to the thickness decrease rate in a lower region of opening 620. As an example, thickness ratio of $T_2$ over $T_1$ can be between about 0.7 and about 0.8, and thickness ratio of $T_3$ over $T_2$ can be between about 0.4 and about 0.5. in some embodiments, thickness of protective layer 602 can be between about 2 nm and about 20 nm. For example, thickness of protective layer 602 can be between about 3 nm and about 18 nm, between about 5 nm and about 14 nm, or any suitable thicknesses. In some embodiments, the thickness of protection layer 602 decreases to the extent that it partially covers the sidewall of opening 620 and is not formed at the bottom of opening 620. For example, protection layer 602 thickness $T_3$ can approach or equal to 0. The thickness dimensions and thickness ratios described herein are for exemplary purposes and are not supposed to be limiting.

Protection layer 602 can be formed using any suitable dielectric material, such as silicon nitride. In some embodiments, protection layer 602 can be formed using a material similar to the material of first dielectric material 452. In some embodiments protection layer 602 can be formed using a dielectric material, such as silicon oxynitride, silicon carbon nitride, silicon oxycarbide, or any suitable dielectric material. Protection layer 602 can be disposed using one or more thin film deposition processes such as CVD, PVD, PECVD, ALD, high-density-plasma CVD (HDP-CVD), sputtering, spin-coating, or any combination thereof.

Figure 7:
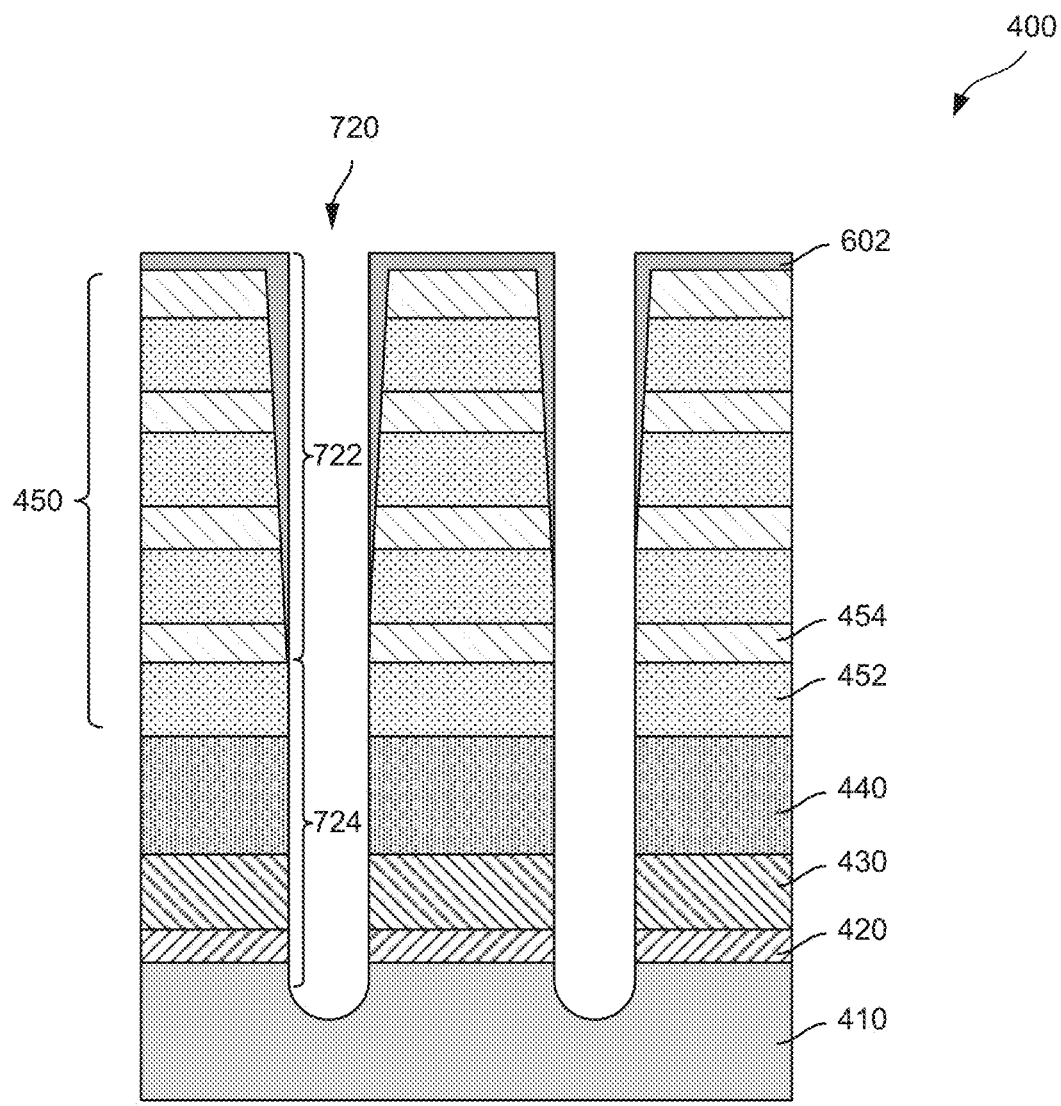

At operation 340, an etching process is performed to fully extend the channel openings through the alternating stack of layers, according to some embodiments of the present disclosure. Referring to FIG. 7, channel openings 720 extend through alternating dielectric stack 450 as well as dielectric layers 420, 430, and 440. In some embodiments, channel openings 720 can also extend into substrate 410. Suitable etching processes, such as dry plasma etching or wet chemical etching, can be used to extend channel openings into substrate 410. In some embodiments, an initial etching process can be used to remove portions of protection layer 602 at the bottom of openings 620 such that underlying material is exposed and prepared for subsequent etching processes. One or more subsequent etching processes can be performed to extend openings 620 of FIG. 6 further into underlying dielectric layers and the substrate, using protection layer 602 as an etch mask. During the subsequent etching processes, protection layer 602 prevents sidewalls of alternating dielectric stack 450 from being laterally etched. For example, sidewalls of alternating dielectric stack 450 covered by protection layer 602 can remain intact while the etching chemicals extend channel openings vertically into underlying dielectric layers and substrate 410. Without the formation of protection layer 602, the etching chemicals tend to cause over-etching at the top of the openings and under-etching at the bottom of the openings. For example, the etching process may remove materials from the top of the openings at a greater etch rate compared to an etching rate at a bottom of the openings. Over-etching top portions of the openings can lead to a greater top width of the openings (e.g., width $W_1$ of opening 520 in FIG. 5), which can cause defects such as adjacent openings merging into each other. Protection layer 602 is formed to mitigate this effect and prevent under-etching lower portions of the opening. For example, protection layer 602 protects upper portion of the opening from being etched while the bottom of opening 602 is etched to extend deeper in the vertical direction. The one or more etching processes can continue until a nominal etching depth is achieved, such as when a portion of substrate 410 is exposed and channel openings 720 are formed.

The one or more etching processes can utilize suitable etching processes configured to remove dielectric materials of alternating dielectric stack and/or any underlying material. For example, the one or more etching processes can include etching chemicals for removing SiO2, SiN, SiON, SiCN, and/or any other materials. The one or more etching processes can be similar to those performed for forming openings 520 described above with regard to FIG. 5.

Channel openings 720 can include an upper portion 722 and a lower portion 724. For the ease of description, upper portion 722 includes portions of channel openings 720 that are surrounded by protection layer 602. Thickness of protection layer 602 formed on sidewalls of alternating dielectric layer stack 450 can decrease within channel openings 720. Lower portions 724 of channel opening 720 extends from the end of protection layer 602 to bottom of channel opening 720. In some embodiments, lower portions 724 of channel opening 720 is not covered by protection layer 602.

Figure 8:
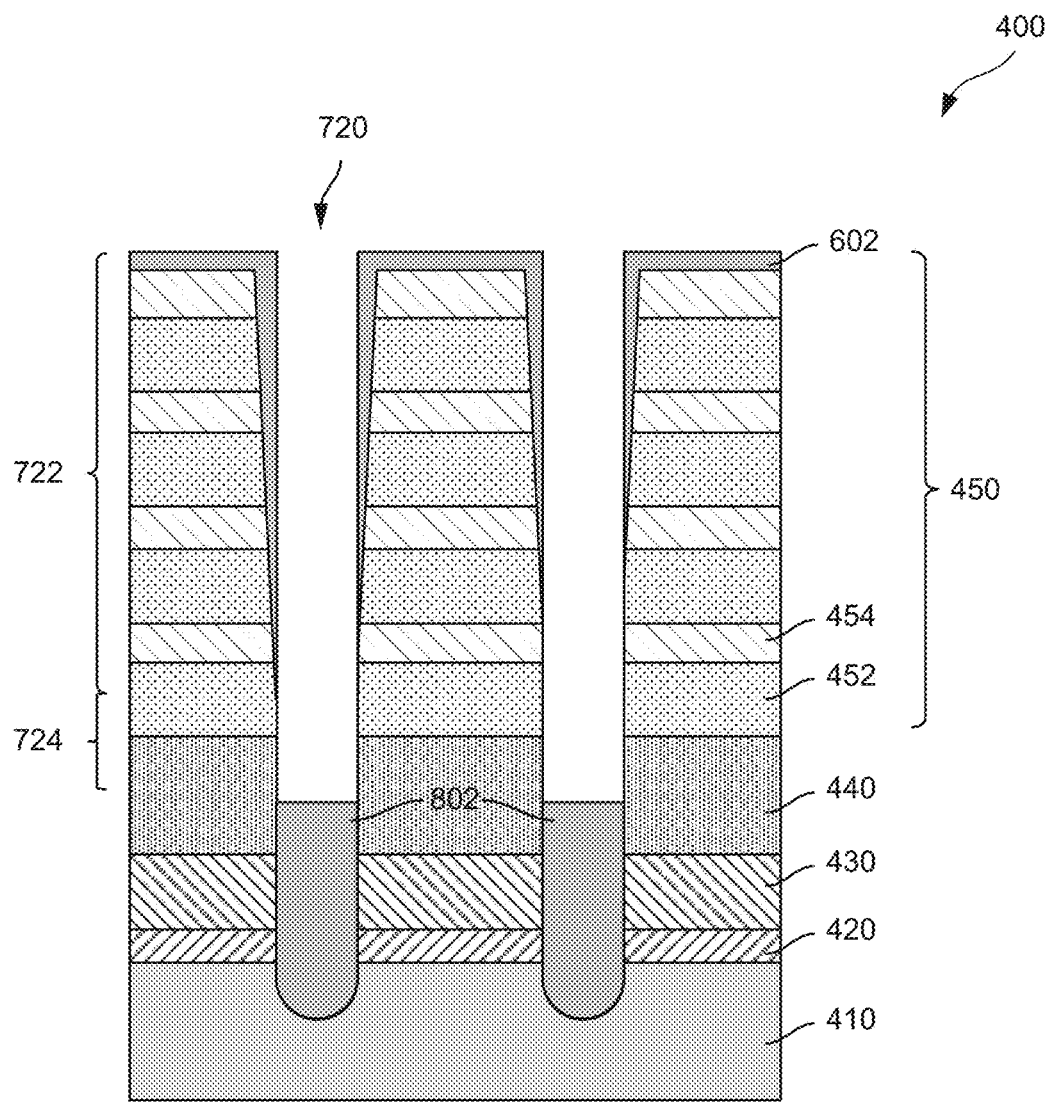

At operation 350, epitaxial regions can be formed in the channel openings, according to some embodiments of the present disclosure. Referring to FIG. 8, epitaxial regions 802 can be formed at bottom of channel openings 720. In some embodiments, epitaxial regions 802 are formed in lower portions 724 of channel openings 720. Epitaxial regions 802 can be formed by selectively growing epitaxial material using substrate 410 as a seed layer. In some embodiments, epitaxial regions 802 can be formed using single crystalline silicon or polycrystalline silicon material. In some embodiments, epitaxial regions 802 can be formed using other suitable material, such as silicon germanium. Epitaxial regions 802 can be disposed using any suitable methods, such as molecular beam epitaxy (MBE), CVD, ALD, any suitable epitaxial processes, and/or combinations thereof. In some embodiments, epitaxial regions 802 can be a portion of subsequently formed channel structures.

Figure 9:
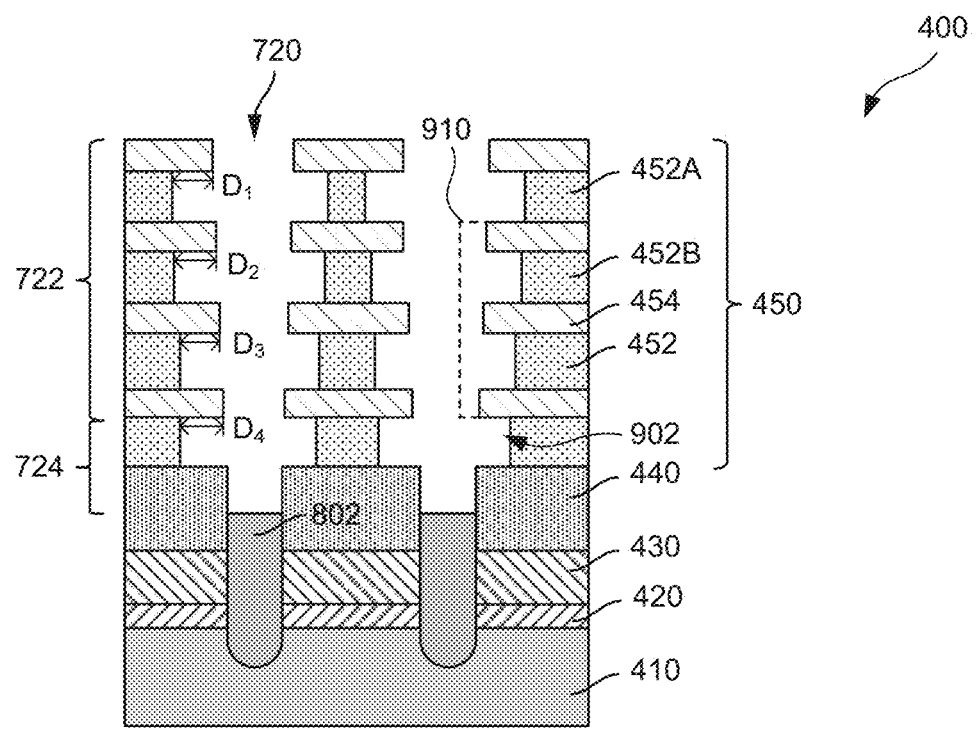

At operation 360, recesses are formed between adjacent dielectric layers of the alternating dielectric stack, according to some embodiments of the present disclosure. Referring to FIG. 9, recesses 902 can be formed between adjacent second dielectric layers 454 by horizontally etching back first dielectric layers 452.

Recesses 902 can be formed by performing an etching process on semiconductor structure 400 illustrated in FIG. 8. In some embodiments, protection layer 602 and first dielectric layer 452 can be formed using similar materials and have similar etching rates against a chemical etchant. Second dielectric layer 454 can be formed using a material different from protection layer 602, therefore achieving high etching selectivity. For example, protection layer 602 and first dielectric layer 452 can both be formed of SiN, and second dielectric layer can be formed of $SiO_2$. The high etching selectivity enables recesses 902 to be formed between adjacent second dielectric layers. In some embodiments, the etching process can be a wet chemical etching processes, during which semiconductor structure 400 is immersed into a suitable wet chemical etchant, such as a phosphoric acid solution. In some embodiments, the etching process can be a dry plasma etching process using suitable chemical etchants, such as octafluorocyclobutane ($C_4F_8$), hexafluorobutadiene ($C_4F_6$), hydrogen fluoride ($H_2F_2$), oxygen ($O_2$), any suitable chemical etchants, and/or combinations thereof. Recesses 902 can be formed between adjacent pair of second dielectric layers 454 of alternating dielectric stack 450. At the beginning of the etching processes, internal sidewall surfaces of alternating dielectric stack 450 positioned within upper portions 722 of channel opening 720 are covered by protection layer 602, while sidewalls surfaces positioned within lower portion 724 of channel opening 720 are not covered and therefore exposed. The etching processes begins by gradually removing protection layer 602 and portions of first dielectric layer 452 exposed within lower portions 724 of channel opening 720. Because protection layer 602 has a gradually decreasing thickness, as it is etched back, more and more layers of alternating dielectric stack 450 are exposed from bottom up. Since etching rates are greater toward the bottom of channel opening 720, the etch-back of protection layer 602 provides an "etch delay" for first dielectric layers 452 located within upper portion 722. The higher a first dielectric layer 452 is positioned within alternating dielectric stack 450, the later it is exposed to the etching chemicals, and the less time it is allowed to react with the etching chemicals. In other words, durations of etching time is less for first dielectric layers 452 previously covered by protection layer 602 compared to durations of etching time for first dielectric layers in lower portions 724 not covered by protection layer 602. Within upper portion 722, durations of etching time for respective first dielectric layers 452 gradually decrease because a first dielectric layer 452 formed above another first dielectric layer 452 is exposed to the etching chemicals later than the another first dielectric layer 452. For example, an etching time of upper first dielectric layer 452A is less than an etching time of lower first dielectric layer 452B. The etching process can continue until nominal depths of recesses 902 are achieved. In some embodiments, the etching process continues until protection layer 602 is removed. In some embodiments, recess depths can be between about 200 Å and about 500 Å.

Figure 10:
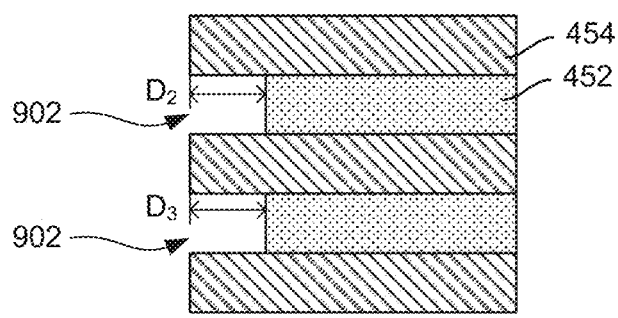

FIG. 10 is an enlarged view of region 910 illustrated in FIG. 9. As a result of the "etch delay" provided by protection layer 602, recess depths $D_1$, $D_2$, $D_3$, and $D_4$ of recesses 902 throughout the depth of channel opening 720 can be substantially equal (e.g., recess depths $D_1$, $D_2$, $D_3$, and $D_4$ can be within about 5% of each other. For example, recess depth $D_1$ and be within about 5% of recess depth $D_2$. In other words, each second dielectric layer 454 protrudes from an adjacent first dielectric layer 452 by substantially the same distance. Although the etching time of upper first dielectric layer 452A is less than the etching time of lower first dielectric layer 452B, the higher etching rate of upper first dielectric layer 452A compensates for the lower etching time, resulting in recess depths $D_2$ and $D_3$ being substantially equal. In some embodiments, recess depths $D_1$, $D_2$, $D_3$, and $D_4$ can be between about 8 and about 12 nm. For example, recess depths $D_1$, $D_2$, $D_3$, and $D_4$ can be between about 9 nm and about 11 nm.

At operation 370, memory layers are formed in the recesses, according to some embodiments of the present disclosure. Memory layers including a tunneling layer, a storage layer, and a blocking layer can be arranged along a direction from the center of the channel opening toward the alternating dielectric stack 450 in this order, according to some embodiments. Each memory string can include channel layers and memory layers that form a cylinder shape (e.g., a pillar shape). The memory layer can include ONO dielectrics (e.g., a tunneling layer including silicon oxide, a storage layer including silicon nitride, and a blocking layer including silicon oxide).

FIGS. 11-16 illustrate a portion of semiconductor structure 400 during various stages of the formation of memory layers. In some embodiments, the portion of semiconductor structure 400 illustrated in FIGS. 11-16 are structures contained in enlarged view 910 of semiconductor structure 400 of FIG. 9. Memory layer can include a blocking layer, a storage layer, and a tunneling layer.

Figure 11:
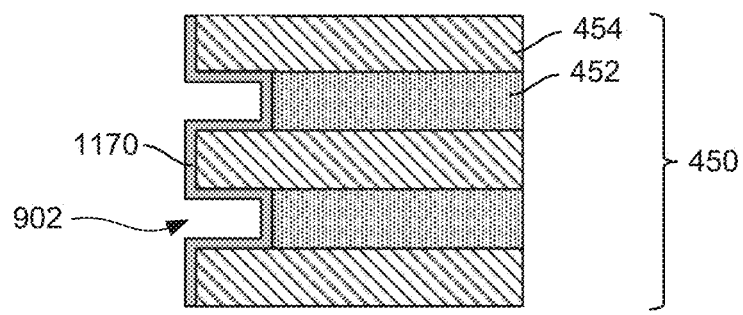

Referring to FIG. 11, blocking layer 1170 is formed on exposed surfaces of alternating dielectric stack 450. For example, blocking layer 1170 can be blanket formed on etched-back first dielectric layer 452 as well as horizontal and vertical surfaces of second dielectric layer 454. In some embodiments, blocking layer 1170 can be formed of $SiO_2$. In some embodiments, blocking layer 1170 can also include SiN, aluminum oxide ($Al_2O_3$), high dielectric constant (high-k) dielectrics (e.g., material having dielectric constant greater than about 3.9), and/or any combinations thereof. Blocking layer 1170 can be formed using thin film deposition methods, such as CVD, PVD, PECVD, ALD, HDP-CVD, any suitable deposition methods, and/or combinations thereof. In some embodiments, blocking layer 1170 is also formed on top surfaces of epitaxial regions 802 (not shown in FIG. 11).

Figure 12:
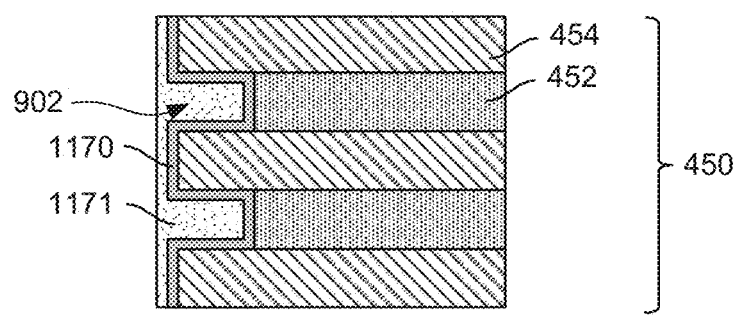

Referring to FIG. 12, a storage layer (also known as "charge trap/storage layer") is formed on blocking layer 1170. Storage layer 1171 can be blanket formed on exposed surfaces of blocking layer 1170, such as vertical and horizontal surfaces of blocking layer 1170. In some embodiments, storage layer 1171 fills recesses 902, as shown in FIG. 12. In some embodiments, storage layer 1171 can include SiN. In some embodiments, the SiN material of storage layer 1171 can also include metal or other semiconductor material. In some embodiments, storage layer 1171 can be insulating materials containing quantum dots or nanocrystals. In some embodiments, storage layer 1171 can include silicon oxynitride, silicon, and/or any combinations thereof. Storage layer 1171 can be formed using thin film deposition methods, such as CVD, PVD, PECVD, ALD, HDP-CVD, any suitable deposition methods, and/or combinations thereof. In some embodiments, storage layer 1171 is also formed above top surfaces of epitaxial regions 802 (not shown in FIG. 12).

Figure 13:
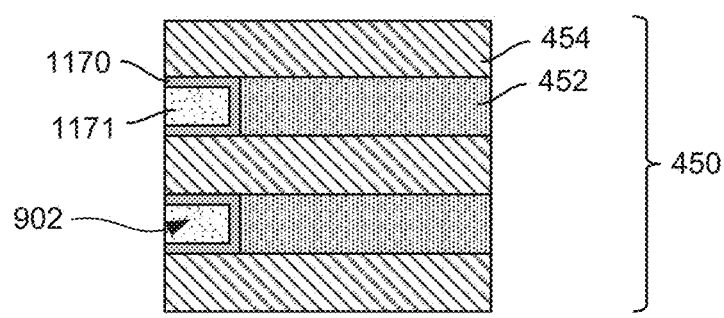

Referring to FIG. 13, excessive material formed outside of recesses is removed such that the storage layer and the blocking layer are formed within recesses. As shown in FIG. 13, blocking layer 1170 and storage layer 1171 formed outside of recesses 902, such as material formed on vertical surfaces of second dielectric layer 454, are removed using suitable etching processes such that blocking layer 1170 and storage layer 1171 are formed within recesses 902. Any suitable etching process can be used to remove portions of blocking layer 1170 and storage layer 1171. For example, a dry plasma etching process or a wet chemical etching process can be used. In some embodiments, a first etching process is used to remove portions of storage layer 1171 followed by a second etching process to remove portions of blocking layer 1170. As a result of the first and second etching processes, second dielectric layer 454 is exposed and the remaining portions of blocking layer 1170 and storage layer 1171 are formed between adjacent second dielectric layers 454, as shown in FIG. 13. Alternatively, although not shown in FIG. 13, only the first etching process may be performed to remove excessive material of storage layer 1171, leaving blocking layer 1170 intact. For example, the etching process continues to remove portions of storage layer 1170 until portions of blocking layer 1170 that is formed on sidewalls of second dielectric layer 454 is exposed.

Figure 14:
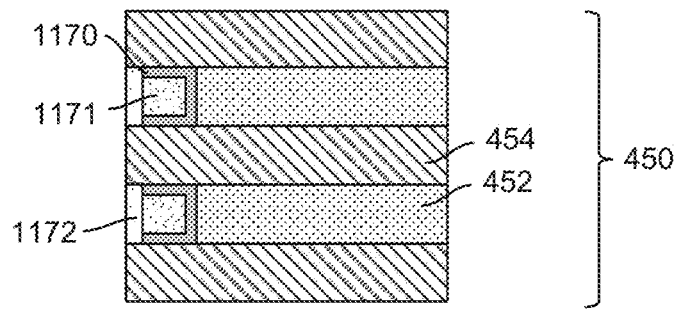
Figure 15:
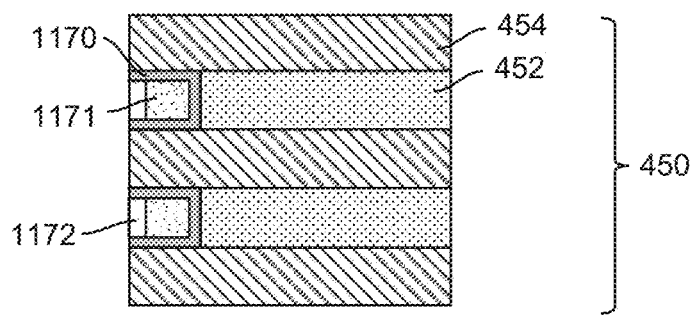

Referring to FIGS. 14 and 15, a tunneling layer is formed in contact with the storage layer. Tunneling layer 1172 can be formed by any suitable methods. FIG. 14 illustrates tunneling layer 1172 formed using an etch-back and deposition method. FIG. 15 illustrates tunneling layer 1172 formed using an oxidization method.

Tunneling layer 1172 shown in FIG. 14 can be formed by etching back end portions of blocking layer 1170 and storage layer 1171 and depositing a dielectric material on the etched-back layers. For example, one or more etching processes can laterally remove portions of blocking layer 1170 and storage layer 1171 not protected by second dielectric layer 454. The etching process continues until a nominal depth is reached. A deposition process is subsequently performed to dispose a dielectric material on the etched-back blocking layer 1170 and storage layer 1171 to form tunneling layer 1172, as shown in FIG. 14. Tunneling layer 1172 formed using this method is in contact with horizontal surfaces of adjacent second dielectric layers 454.

Tunneling layer 1172 shown in FIG. 15 can be formed by partially oxidizing end portions of storage layer 1171. In some embodiments, oxidization processes such as heated oxidization processes or in-site steam generation processes can be applied to oxidize exposed end portions of storage layer 1171. As a result, the oxidized end portions of storage layer 1171 can form tunneling layer 1172. In some embodiments, tunneling layer 1172 can be formed using a silicon oxide material. Using an oxidization process to form tunneling layer 1172 can provide various benefits, including but not limited to, less nitrogen migration from storage layer 1171, improved film interface quality, improved device life cycles, higher fabrication yield, among other things. In addition, no additional deposition process is needed. Forming tunneling layer 1172 via oxidization also eliminates the need of removing tunneling layer 1172 from the top surface of epitaxial region 802 in preparation of subsequent processes, thereby reducing fabrication complexity and improving fabrication yield. Tunneling layer 1172 formed using this method is not in contact with horizontal surfaces of adjacent second dielectric layers 454.

Figure 16:
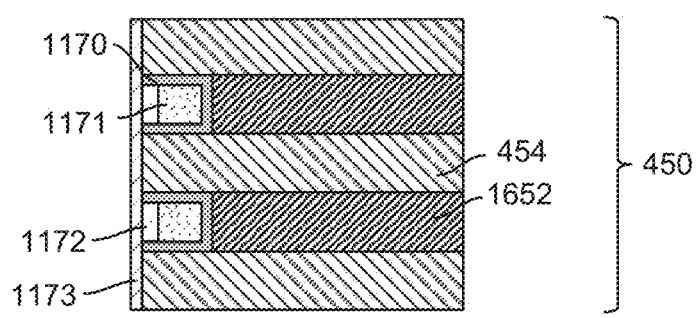

Referring to FIG. 16, a channel layer is formed in contact with the blocking layer and the tunneling layer. For example, channel layer 1173 is formed in contact with end portions of blocking layer 1170 and tunneling layer 1172 if tunneling layer 1172 is formed using an oxidization process. In some embodiments, channel layer 1173 is not in contact with blocking layer 1170. Channel layer 1173 can be formed using a material containing silicon. For example, channel layer 1173 can be formed using amorphous silicon, poly-silicon, single crystalline silicon, or any suitable silicon material. In some embodiments, channel layer 1173 can be formed using a doped silicon material. In some embodiments, additional layers such as liner layers, insulating layers, barrier layers, can be formed between channel layer 1173 and tunneling layer 1172 and are not illustrated in FIG. 16 for simplicity.

After memory layers are formed, first dielectric layer 452 can be replaced by a conductive layer. The replacement process can include performing one or more etching processes to remove dielectric layer 452 and also include disposing a conductive layer 1652, as shown in FIG. 16. Second dielectric layers 454 can be substantially inert to the etching process such that only dielectric layer 452 is removed. For example, the etching process can be a wet chemical etching process using phosphoric acid as the etching chemical. In some embodiments, a dry plasma etching process can be applied using precursors such as $C_4F_8$, $C_4F_6$, $H_2F_2$ and $O_2$, any suitable chemical etchants, and/or combinations thereof. Conductive layer 1652 can be disposed in place of the removed dielectric layer 452 and form selection gate structures such as source selection gate (SSG) and/or drain selection gate (DSG). Conductive layer 1652 can be formed using any suitable conductive material, such as tungsten (W), cobalt (Co), copper (Cu), aluminum (Al), polysilicon, doped silicon, silicides, and/or any combinations thereof.

Various embodiments in accordance with the present disclosure provide structures and fabricating methods for channel structures that improves data retention and reduce coupling between adjacent memory cells. The fabrication method disclosed herein can prevent over-etching and under etching of upper and lower portions of the channel opening, respectively. Channel openings are formed by a multi-step etching process. The upper portions of the opening is protected by a protection layer with decreasing thicknesses. The non-uniform thickness of the protection layer enables selective etch of lower portions of the opening, which in turn provides the benefit, for example, of forming a channel opening with uniform width in both the upper and lower portions of the opening.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional memory device, comprising:
    forming an alternating dielectric stack on a substrate;
    forming an opening extending partially through the alternating dielectric stack, wherein the opening exposes sidewalls of the alternating dielectric stack;
    disposing a dielectric protection layer in the opening and on the exposed sidewalls of the alternating dielectric stack, the dielectric protection layer having a thickness that decreases along a first direction extending from a top to a bottom of the opening;
    forming a plurality of recesses via an etching process on a plurality of first dielectric layers; and
    forming channel layers in the plurality of recesses, wherein forming the channel layers comprises:
        disposing a blocking layer, a storage layer, and a tunneling layer; and
        removing excess material from an outside surface of the plurality of recesses, wherein the storage layer, the blocking layer, and the tunneling layer are formed within the plurality of recesses.

2. The method of claim 1, further comprising extending the opening through the alternating dielectric stack.

3. The method of claim 1, wherein disposing the dielectric protection layer comprises depositing silicon nitride.

4. The method of claim 2, wherein extending the opening comprises exposing a portion of the substrate.

5. The method of claim 4, further comprising disposing an epitaxial region in the extended opening and on the exposed portion of the substrate.

6. The method of claim 1, wherein forming the alternating dielectric stack comprises disposing first dielectric layers and second dielectric layers in an alternating manner.

7. The method of claim 6, further comprising etching back the dielectric protection layer to sequentially expose each first dielectric layer of a plurality of first dielectric layers in a second direction, the second direction opposite to the first direction.

8. The method of claim 7, further comprising horizontally etching back the plurality of first dielectric layers to form the plurality of recesses between a pair of adjacent second dielectric layers.

9. The method of claim 8, wherein horizontally etching back the plurality of first dielectric layers comprises etching an upper first dielectric layer and a lower first dielectric layer of the plurality of first dielectric layers for a first duration of time and a second duration of time, the first duration of time different than the second duration of time.

10. The method of claim 9, wherein:
    the upper first dielectric layer is formed above the lower first dielectric layer;
    the first duration of time is less than the second duration of time; and an etching rate of the upper first dielectric layer is greater than an etching rate of the lower first dielectric layer.

11. The method of claim 1, wherein the blocking layer includes a first portion, a second portion, and a third portion, the first portion and the third portion are parallel to each other and contact a first dielectric layer and a second dielectric layer, the first portion, the second portion, and the third portion further enclose the storage layer, and the tunneling layer encloses the blocking layer and the storage layer within the plurality of recesses, wherein the tunneling layer is in contact with a channel structure at a first end and in contact with the blocking layer and the storage layer at a second end.

12. A method for forming a three-dimensional memory device, comprising:
  forming an alternating dielectric stack on a substrate, comprising disposing a plurality of first dielectric layers and a plurality of second dielectric layers in an alternating manner;
  forming an opening in the alternating dielectric stack to expose a first sidewall portion of the alternating dielectric stack;
  disposing a protection layer in the opening and on the exposed first sidewall portion, wherein a thickness of the protection layer gradually decreases from a top to a bottom of the opening;
  extending the opening further into the alternating dielectric stack to expose a second sidewall portion of the alternating dielectric stack;
  performing an etching process on the plurality of first dielectric layers to form a plurality of recesses, comprising:
    etching back a first portion of the plurality of first dielectric layers through the exposed second sidewall portion;
    etching back the protection layer to expose the first sidewall portion; and
    etching back a second portion of the plurality of first dielectric layers through the exposed first sidewall portion; and
  forming channel layers in the plurality of recesses, wherein forming the channel layers comprises:
    disposing a blocking layer, a storage layer, and a tunneling layer; and
    removing excess material from an outside surface of the plurality of recesses, wherein the storage layer, the blocking layer, and the tunneling layer are formed within the plurality of recesses.

13. The method of claim 12, wherein disposing the plurality of first dielectric layers and disposing the protection layer comprise depositing silicon nitride.

14. The method of claim 12, wherein a duration of etching time for the first portion of the plurality of first dielectric layers is greater than a duration of etching time for the second portion of the plurality of first dielectric layers.

15. The method of claim 12, wherein etching back the protection layer comprises sequentially exposing each first dielectric layer of the second portion of the plurality of first dielectric layers in a direction extending from the bottom to the top of the opening.

16. A three-dimensional memory device, comprising:
  an alternating stack of layers on a substrate, comprising a plurality of dielectric layers and a plurality of conductive layers disposed in an alternating manner;
  a channel structure extending through the alternating stack of layers, wherein each dielectric layer of the plurality of dielectric layers protrudes from an adjacent conductive layer of the plurality of conductive layers by a distance, and wherein the distance of each dielectric layer of the plurality of dielectric layers are substantially the same; and
  a memory layer formed between each conductive layer and the channel structure, wherein the memory layer includes a storage layer, a blocking layer, and a tunneling layer formed within a plurality of recesses.

17. The three-dimensional memory device of claim 16, wherein the tunneling layer extends across one of the plurality of recesses, wherein the tunneling layer contacts the channel structure on a first side and the blocking layer and the storage layer on a second side.

18. The three-dimensional memory device of claim 16, wherein the channel structure is in contact with the blocking layer.

19. The three-dimensional memory device of claim 16, wherein the tunneling layer covers end portions of the blocking layer.

20. The three-dimensional memory device of claim 16, wherein the blocking layer is in contact with a horizontal surface of each dielectric layer of the plurality of dielectric layers.

* * * * *